(12) United States Patent
Chen et al.

(10) Patent No.: US 9,787,308 B2
(45) Date of Patent: *Oct. 10, 2017

(54) REFERENCE VOLTAGE GENERATING DEVICE AND METHOD

(71) Applicant: Intel Corporation, Santa Clara, CA (US)

(72) Inventors: Ping-Hsing Chen, Taipei (TW); Ming-Yi Yu, Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/090,548

(22) Filed: Apr. 4, 2016

(65) Prior Publication Data

US 2016/0359485 A1    Dec. 8, 2016

Related U.S. Application Data

(63) Continuation of application No. 14/631,852, filed on Feb. 26, 2015, now Pat. No. 9,304,526.

(30) Foreign Application Priority Data

Feb. 27, 2016   (CN) .......................... 2014 1 0068218

(51) Int. Cl.
*G05F 1/10*   (2006.01)
*H03K 19/00*   (2006.01)
*G05F 1/67*   (2006.01)
*G05F 1/46*   (2006.01)

(52) U.S. Cl.
CPC ......... *H03K 19/0016* (2013.01); *G05F 1/468* (2013.01); *G05F 1/67* (2013.01)

(58) Field of Classification Search
None
See application file for complete search history.

(56) References Cited

U.S. PATENT DOCUMENTS

| 6,683,481 | B1* | 1/2004 | Zhou .................... H03K 17/223 |
| | | | 327/143 |
| 6,750,685 | B1* | 6/2004 | Guerrero |
| | | | Mercado ............ H03K 17/6872 |
| | | | 327/108 |
| 9,304,526 | B2* | 4/2016 | Chen ........................ G05F 1/67 |
| 2003/0201807 | A1 | 10/2003 | Ohbayashi et al. |
| 2005/0057287 | A1 | 3/2005 | Gossmann |
| 2015/0241889 | A1* | 8/2015 | Chen ........................ G05F 1/67 |
| | | | 327/143 |

* cited by examiner

*Primary Examiner* — Long Nguyen
(74) *Attorney, Agent, or Firm* — Eschweiler & Potashnik, LLC

(57) ABSTRACT

A reference voltage generating device including a reference voltage source, a charge supplying source, a first switch, a second switch, a charge storage unit and a logic unit is provided. First terminals of the first and second switches are respectively coupled to the output terminal of the reference voltage source and the charge supplying source. When a power on reset signal is received, the first switch is turned off and the second switch is turned on, such that the charge supplying source quickly charges the charge storage unit. When the output voltage is greater than or equal to the reference voltage, the first switch is turned on and the second switch is turned off, such that the reference voltage source maintains the output voltage to the reference voltage.

19 Claims, 5 Drawing Sheets

REFERENCE VOLTAGE GENERATING DEVICE AND METHOD

CROSS-REFERENCE TO RELATED APPLICATION

This application claims the priority benefit of China application serial no. 201410068218.0, filed on Feb. 27, 2014. The entirety of the above-mentioned patent application is hereby incorporated by reference herein and made a part of this specification.

BACKGROUND

Technical Field

The invention relates to an electronic circuit, and particularly relates to a reference voltage generating device and method thereof.

Related Art

Portable electronic products are all developed towards a design trend of low power consumption, fast booting speed, etc., so as to increase a usage and standby time of the electronic products under a same power capacity, and improve consumer's purchase willingness and user experience. Generally, an electronic circuit requires a reference voltage source non-related with an input power and an ambient temperature in internal thereof, such that a processing chip in the electronic circuit can determine accuracy of a signal according to a reference voltage. Namely, the reference voltage output by the reference voltage source is required to have characteristics of high power supply rejection ratio (PSRR), low noise, high accuracy, etc. Therefore, in order to make the reference voltage to satisfy the aforementioned requirements, the generated reference voltage is generally transmitted to a low-pass filter and/or a signal clipper (i.e. a clamper) composed of resistors and capacitors for suitable adjustment.

Since the low-pass filter and/or signal clipper is added to an output terminal of the reference voltage source, a longer period of time such as a few hundred milliseconds after power on, and the reference voltage received by the processing chip can be accurate and stable. Namely, a stabilization time of the reference voltage after power on is probably too long, which delays a booting speed of the electronic product. A bandgap circuit with a smaller output current is generally used to serve as a generating device of the reference voltage, such that the capacitor at the output terminal has to take a longer time to stabilize the reference voltage. In component selection of the low-pass filter, if a resistor with a larger resistance is selected, the potential of the reference voltage is deviated and inaccurate, so that a larger capacitance and a smaller resistance are generally selected, though the stabilization time of the reference voltage is further prolonged.

Therefore, to design a reference voltage source occupying less circuit board area and capable of quickly providing the reference voltage to the processing chip is an urgently needed circuit design direction.

SUMMARY

The invention is directed to a reference voltage generating device, which is capable of effectively shortening a stabilization time of a reference voltage, so as to avoid prolonging an unstable state of the reference voltage due to selection of a resistance of a filter, and achieving an effect of saving a circuit board area.

The invention provides a reference voltage generating device including a reference voltage source, a charge supplying source, a first switch, a second switch, a charge storage unit and a logic unit. An output terminal of the reference voltage source is used for generating a reference voltage. The charge supplying source is connected to a power voltage. First terminals of the first switch and the second switch are respectively coupled to the output terminal of the reference voltage source and the charge supplying source. The charge storage unit is coupled to second terminals of the first switch and the second switch to serve as an output terminal of the reference voltage generating device, and is used for storing charges and generate an output voltage. The logic unit is used for receiving the reference voltage, the output voltage and a power on reset signal to control the first switch and the second switch. When the power on reset signal is received, the first switch is turned off and the second switch is turned on, such that the charge supplying source quickly charges the charge storage unit. When the output voltage is greater than or equal to the reference voltage, the first switch is turned on and the second switch is turned off, such that the reference voltage source maintains the output voltage to the reference voltage.

In an embodiment of the invention, the logic unit includes a comparator. A non-inverted input terminal of the comparator receives the reference voltage, an inverted input terminal of the comparator receives the output voltage. The comparator is used for determining whether the output voltage is greater than or equal to the reference voltage.

In an embodiment of the invention, the comparator further includes a power control terminal for receiving a power control signal to determine whether to turn off a power of the comparator.

In an embodiment of the invention, the logic unit further includes a third switch. A first terminal of the third switch is coupled to the charge storage unit, a second terminal of the third switch is coupled to the ground, and a control terminal of the third switch receives the power on reset signal. When the power on reset signal is received, the third switch is turned on to clear the charges in the charge storage unit.

In an embodiment of the invention, the reference voltage generating device further includes a resistor. The resistor is coupled between the second terminal of the first switch and the charge storage unit.

According to the above descriptions, in the reference voltage generating device of the invention, after the power on reset signal sends a power reset pulse, the charge supplying source connected to the power voltage is used to quickly charge the output voltage stored in the charge storage unit to a potential the same or similar with that of the reference voltage, and the reference voltage source is used to maintain the potential of the reference voltage. In this way, the reference voltage generating device can effectively shorten the stabilization time of the reference voltage, so as to avoid prolonging the unstable state of the reference voltage due to selection of a capacitance value, the low-pass filter, etc.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In order to avoid a situation that a post low-pass filter and/or a capacitor component therein delays a stabilization time of a reference voltage generated by a reference voltage source, in a reference voltage generating device provided by the invention, a charge supply source connected to a power voltage is used to adjust an output voltage, such that the output voltage can be quickly charged to potential the same or similar with that of the reference voltage. Moreover, when the potential of the output voltage is greater than or equal to the potential of the reference voltage, the reference voltage source is used to maintain the output voltage to the potential of the reference voltage. In this way, the reference voltage generating device of the invention can effectively shorten the stabilization time of the reference voltage, and meanwhile maintain an effect of a low-pass filter, so as to avoid prolonging the unstable state of the reference voltage due to selection of a capacitance value, the low-pass filter, etc. One or a plurality of embodiments are provided below to serve as references for those skilled in the art, and those skilled in the art can suitably replace the following circuit with other circuits having the same effect.

Figure 1:
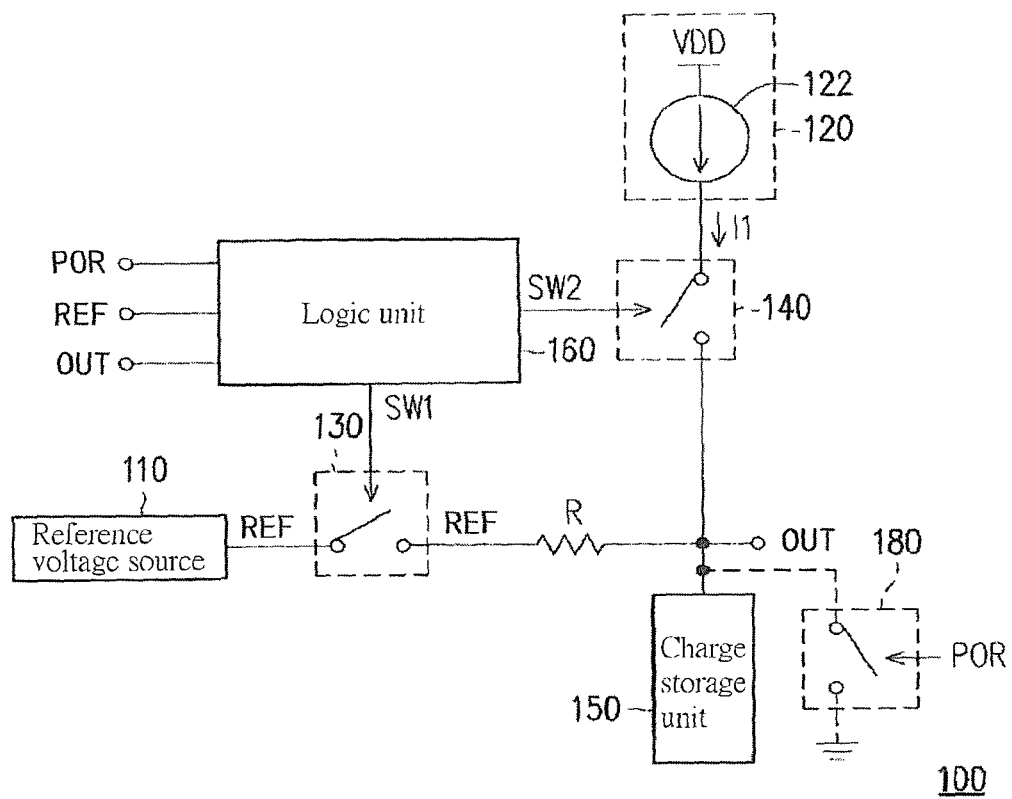
FIG. 1 is a block diagram of a reference voltage generating device according to an embodiment of the invention.

FIG. 1 is a block diagram of a reference voltage generating device 100 according to an embodiment of the invention. The reference voltage generating device 100 is adapted to a plurality of electronic circuits and consumable electronic products, and those skilled in the art can applied the reference voltage generating device 100 to a plurality of circuits. As shown in FIG. 1, the reference voltage generating device 100 includes a reference voltage source 110, a charge supplying source 120, a first switch 130, a second switch 140, a charge storage unit 150 and a logic unit 160. The reference voltage source 110 can be implemented by a reference voltage circuit composed of a bandgap circuit, or can be implemented by a related reference voltage circuit known by those skilled in the art, which is not limited to the bandgap circuit. An output terminal of the reference voltage source 110 is used for generating a reference voltage REF.

The charge supplying source 120 is connected to a power voltage VDD for quickly providing a large amount of current or a large voltage. In the present embodiment, the charge supplying source 120 is implemented by a constant current source 122. The constant current source 122 quickly generates a large current I1 after the power voltage VDD is power on, and charges the charge storage unit 150 when the second switch 140 is turned on. In some embodiments, the charge supplying source 120 can also provide a large voltage, and a potential of an output signal thereof should be greater than a potential of the reference voltage REF.

A first terminal of the first switch 130 is coupled to the output terminal of the reference voltage source 110, and a second terminal of the first switch 130 is connected to the charge storage unit 150 through a resistor R. A first terminal of the second switch 140 is coupled to the charge supplying source 120, and a second terminal of the second switch 140 is connected to the charge storage unit 150. The first switch 130 and the second switch 140 are all controlled by the logic unit 160.

It should be noticed that the resistor R and a capacitor component in the charge storage unit 150 can construct a low-pass filter for suitably adjusting the reference voltage REF and ameliorating a signal to noise ratio (SNR) of an output signal OUT. According to an operation principle of the RC filter, the greater the R value is, the lower the frequency for the low-pass filtering is, the smaller the noise of the output signal OUT is, and the better the SNR is. The reference voltage REF is changed to the output signal OUT after passing through the resistor R.

However, in related embodiments complying with the spirit of the invention, the reference voltage generating device 100 can also be implemented without using the resistor R. In other words, the charge storage unit 150 can be directly coupled to the second terminal of the first switch 130 without connecting the same through the resistor R, so as to produce the output signal OUT of the reference voltage generating device 100, and the charge storage unit 150 is coupled to the second terminal of the second switch 140. Since the resistor R can be omitted, in some embodiment that the resistor R is not used, an area of a circuit board is saved, and a situation that a leakage current of the output terminal flows through the large resistor R to cause a voltage drop to result in a potential variation of the output signal OUT is avoided.

The charge storage unit 150 is used for storing charges. In the present embodiment, the charge storage unit 150 is implemented by a capacitor. However, those skilled in the art can also implement the charge storage unit 150 complying with the spirit of the invention by using other circuit components or circuit structures.

The logic unit 160 is used for generating two control signals, wherein the signal used for controlling the first switch 130 is referred to as a first switching signal SW1, and the second signal used for controlling the second switch 140 is referred to as a second switching signal SW2. The logic unit 160 receives the reference voltage REF, the output signal OUT and a power on reset signal POR provided by an external circuit. The power on reset signal POR is provided by an external electronic circuit or a related consumable electronic product. In other words, when a user wants to start or restart the electronic circuit or the consumable electronic product using the reference voltage generating device 100, the user may press a button or use a related technique to power on the power voltage VDD, and when the power voltage VDD is power on, the power on reset signal POR generates a power reset pulse PRP. Now, the reference voltage generating circuit 100 is started or restarted, and generates the stable output signal OUT within a stabilization time. A purpose of the invention is to make the stabilization time of the output signal OUT as short as possible.

In a conventional circuit, since the charge supplying source 120 is not used, the circuit only charges the charge storage unit 150 through the reference voltage source 110, which leads to a longer charging time, and it takes a longer time before the output signal enters a stable state. In the invention, before the output signal OUT reaches the reference voltage REF, the first switch 130 is first turned off, the second switch 140 is turned on, and the charge supplying source 120 charges the charge storage unit 150. Since the voltage of the charge supplying source 120 is greater than the reference voltage REF, and in the present embodiment, the charge supplying source 120 is implemented by the constant current source 122, a charging speed that the charge supplying source 120 charges the charge storage unit 150 is far greater than a charging speed that the reference voltage source charges the charge storage unit 150. In this way, the time required by the output signal for entering the stable state is greatly shortened to achieve the purpose of the invention. As the output signal OUT is quickly increased, after the voltage of the output signal OUT is equal to the reference voltage REF, the first switch 130 is turned on, and the second switch 140 is turned off, such that the charge supplying source 120 stops charging the charge storage unit 150, and now the output signal OUT is equal to the reference voltage REF that is processed by the low-pass filter composed of the resistor R and the charge storage unit 150 implemented by a capacitor. In this way, the effect of shortening the stabilization time of the output signal is achieved.

At the moment when the first switch 130 is turned off, and the second switch 140 is turned on, since one end of the resistor R is not connected to any component, an initial value of the output signal OUT is an uncertain signal, so that a circuit controlled by the third switch 180 is added to ground the output signal OUT at the aforementioned moment, so as to eliminate the uncertain signal in the circuit.

Figure 2:
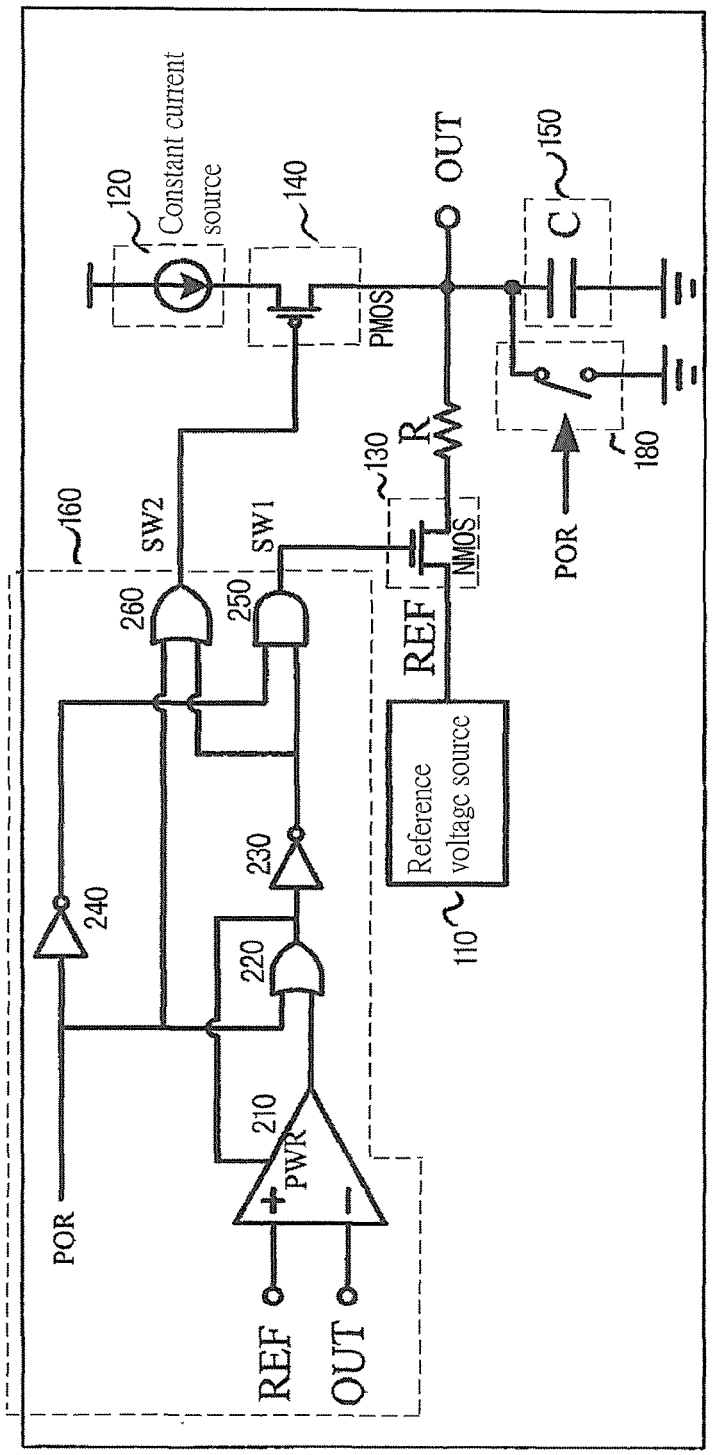
FIG. 2 is a first circuit diagram of a reference voltage generating device according to an embodiment of the invention.

Circuit implementations complying with the spirits of the embodiment of the invention are provided below. Referring to FIG. 2, FIG. 2 is a circuit diagram of the reference voltage generating device 100 according to an embodiment of the invention. In the present embodiment, the charge storage unit 150 of the reference voltage generating device 100 is implemented by a capacitor C. The first switch 130 is implemented by an N-type metal oxide semiconductor field effect transistor (NMOSFET/N-type MOSFET), the second switch 140 is implemented by a P-type metal oxide semiconductor field effect transistor (PMOSFET/P-type MOSFET), and the third switch 180 is controlled by the power on reset signal POR. The same components in FIG. 1 and FIG. 2 have the same effects and circuit structures. Those skilled in the art should understand that logic levels required for turning on/off the NMOSFET and the PMOSFET are different.

Components and a circuit structure of the logic unit 160 of FIG. 2 are described below. The logic unit 160 mainly includes a comparator 210, a first OR gate 220, a first inverter 230, a second inverter 240, an AND gate 250 and a second OR gate 260. The comparator 210 of the logic unit 160 determines a potential relationship between the output signal OUT and the reference voltage REF according to the reference voltage REF and the output signal OUT. The comparator 210 is, for example, an ideal comparator. A non-inverted input terminal of the comparator 210 receives the reference voltage REF, and an inverted input terminal of the comparator 210 receives the output signal OUT, and the comparator 210 determines whether the output signal OUT is greater than or equal to the reference voltage REF.

A first input terminal of the first OR gate 220 is coupled to an output terminal of the comparator 210, a second input terminal of the first OR gate 220 and the inverter 240 receive the power on reset signal POR. An input terminal of the first inverter 230 is coupled to an output terminal of the first OR gate 220, and an output terminal of the first inverter 230 is coupled to a first terminal of the AND gate 250 and a first input terminal of the second OR gate 260. A second terminal of the AND gate 250 is connected to an output terminal of the second inverter 240, and an output terminal of the AND gate 250 generates a first switching signal SW1 and is coupled to the control terminal of the first switch 130. An output terminal of the second OR gate 260 generates a second switching signal SW2 and is coupled to the control terminal of the second switch 140.

In this way, when the potential of the output signal OUT is smaller than the potential of the reference voltage REF, the first switching signal SW1 can be logic 0 to turn off the first switch 130, and the second switching signal SW2 is logic 0 to turn on the second switch 140. When the potential of the output signal OUT is greater than or equal to the potential of the reference voltage REF, the first switching signal SW1 is logic 1 to turn on the first switch 130, and the second switching signal SW2 is logic 1 to turn off the second switch 140.

It should be noticed that after the logic unit 160 receives the power on reset signal POR, the reference voltage REF and the output signal OUT, switching of the first switch SW1 and the second switch SW2 may cause floating of the output voltage OUT, which probably leads to instability of the output voltage OUT to cause error of a post chip. Therefore, a third switch 180 is added to the charge storage unit 150. A first terminal of the third switch 180 is coupled to the charge storage unit 150, a second terminal of the third switch 180 is coupled to the ground, and a control terminal of the third switch 180 receives the power on reset signal POR. When the power reset pulse PRP of the power on reset signal POR is received, the third switch 180 is turned on to clear the charges in the charge storage unit 150, so as to avoid excessive potential of the output signal OUT. In an actual application, the third switch can be omitted.

The above operations are described in detail below with reference of FIG. 2 and FIG. 3.

Figure 3:
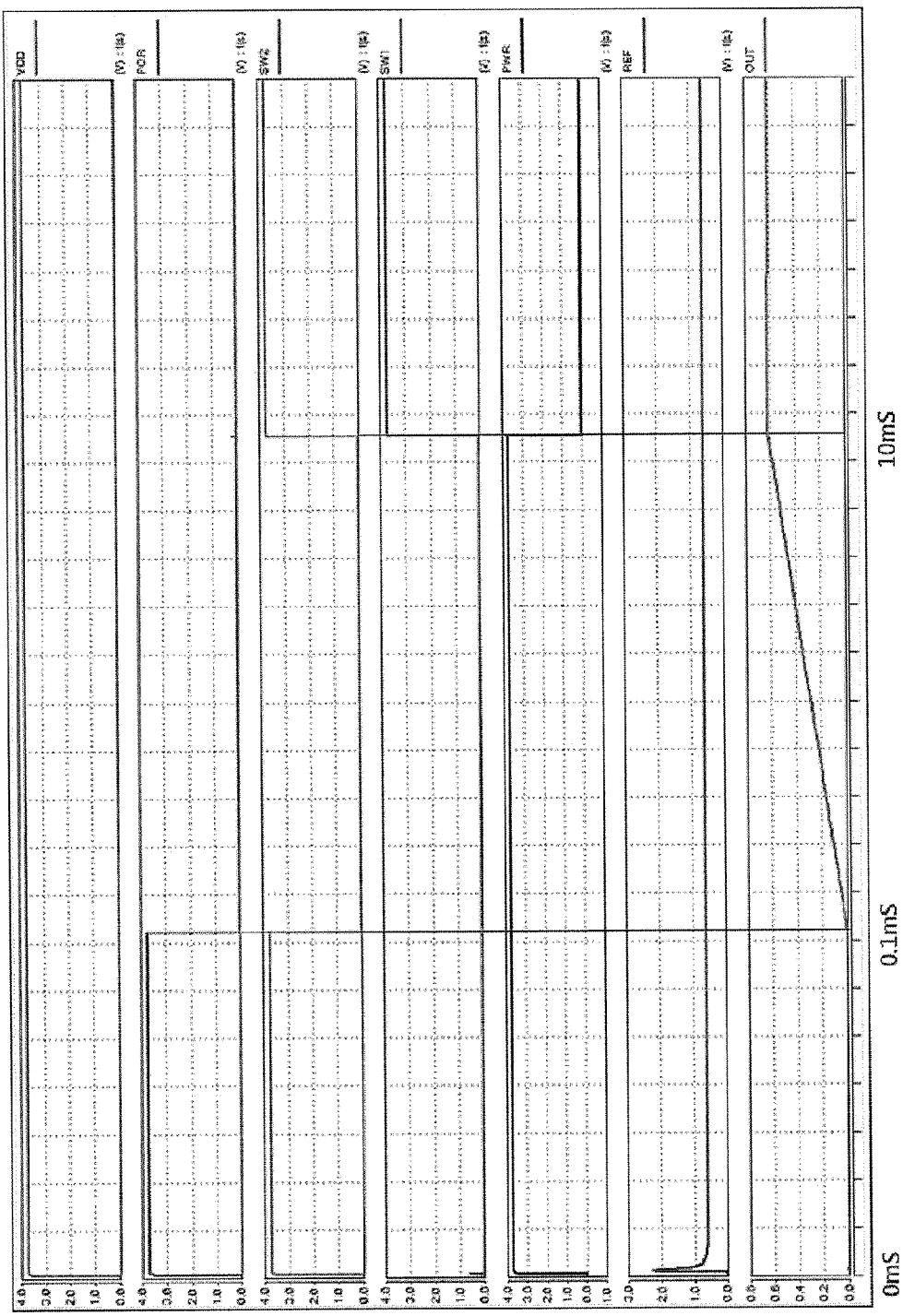
FIG. 3 is a waveform diagram of main signals in the reference voltage generating device of FIG. 2.

For simplicity's sake, referring to FIG. 2 and FIG. 3, FIG. 3 is a waveform diagram of main signals of the reference voltage generating device 100 according to an embodiment of the invention. A potential of the power voltage VDD, the power on reset signal POR, the first switching signal SW1 and the second switching signal SW2 in logic 1 is 3.7V, and an ideal reference voltage REF is 0.6V. The aforementioned voltage values are only an example, and the potential can be determined according to a design requirement in actual applications. In the present embodiment, the first switch 130 and the second switch 140 can be respectively implemented by an NMOSFET and a PMOSFET.

In FIG. 3, when the user powers on the power voltage VDD at a 0 ms, the power on reset signal POR generates the power reset pulse PRP at 0 ms, and the third switch 180 is turned on under control of the power on reset signal POR during a period when the power reset pulse PRP is generated, such that the output signal OUT is connected to the ground, and the voltage value thereof is 0. The ideal reference voltage source 110 provides the ideal reference voltage REF. Now, when the logic unit 160 receives the power reset pulse PRP in the power on reset signal POR, the logic unit 160 disables the first switching signal SW1, for example, sets the first switching signal SW1 to logic 0, to turn off the first switch 130. Moreover, the logic unit 160 enables the second switching signal SW2, for example, sets the second switching signal SW2 to logic 1, such that the first switch 130 and the second switch 140 are turned off During the period when the power reset pulse PRP is generated, the reference voltage source 110 and the comparator 210 are activated, and after the power reset pulse PRP is ended, the second switching signal SW2 is set to logic 0, and the charge supplying source 120 driven by the power voltage VDD can generate a large current to quickly charge the charge storage unit 150. Referring to FIG. 2, when the power voltage VDD is power on, the output voltage OUT is 0, the reference voltage REF has a high potential, and the output terminal of the comparator 210 outputs a signal of logic 1, and after passing through the first OR gate 220, the signal is still logic 1, and after pasting through the first inverter 230, the signal is changed to logic 0 and is input to the first input terminal of the AND gate 250 and the first input terminal of the second OR gate 260. Within a transient period after the power voltage VDD is power on, for example, a period of 0-10 ms in the present embodiment, the power on reset signal POR generates the power reset pulse PRP, within the period of 0-10 ms, the power reset pulse PRP is changed to logic 0 after passing through the second inverter 240, and is input to the second input terminal of the AND gate 250. On the other hand, the high potential of the power reset pulse PRP is directly input to the second input terminal of the second OR gate 260. During the period of 0-10 ms, it is known that the two input terminals of the AND gate 250 are respectively two logic 0, so that the output terminal of the AND gate 250 outputs the logic 0, and the first switching signal SW1 is logic 0 during the period of 0-10 ms. During the period of 0-10 ms, the two input terminals of the OR gate 260 are respectively logic 0 and logic 1, so that the output terminal of the second OR gate 260 outputs the logic 1, and the second switching signal SW2 has a high potential during the period of 0-10 ms. In the embodiment of FIG. 2, the first switch 130 is implemented by the NMOSFET, and the second switch 140 is implemented by the PMOSFET, so that during the period of 0-10 ms, the first switch 130 is turned off,.

the second switch 140 is also turned off, and the third switch 180 directly controlled by the power on reset signal POR is turned on. Therefore, during the period of 0-10 ms, the output signal OUT is connected to the ground to obtain a stable start voltage, so as to avoid instability of the circuit. Meanwhile, the first switch and the second switch are all turned off to avoid unnecessary energy consumption of the circuit.

In the following time, during a period of 0.1 ms-10 ms, the output voltage OUT has the initial value of 0, and is continuously increased, and before the output voltage OUT is increased to the reference voltage REF, the comparator keeps outputting a signal of logic 1, and after passing through the first OR gate 220, the signal is still logic 1, and after passing through the first inverter 230, the signal is changed to logic 0, so that after passing through the AND gate 250, the signal is logic 0. Therefore, during the period of 0.1 ms-10 ms, the first switching signal SW1 is logic 0, and the first switch 130 implemented by the NMOSFET is turned off. After the power reset pulse PRP is generated, the power on reset signal POR is kept to a low potential, so that the two input terminals of the second OR gate 260 are all logic 0, the second switching signal is logic 0, and the second switch 140 implemented by the PMOSFET is turned on, and the current source charges the charge storage unit 150. Since the charging speed of the current source is obviously faster than that of the reference voltage source 110, the output voltage can be quickly increased within a short time.

When the potential of the output signal OUT is greater than or equal to the potential of the reference voltage REF, generally, when the potential of the output signal OUT is equal to the potential of the reference voltage REF, for example, at the $10^{th}$ ms shown in FIG. 3, the logic unit 160 changes the first switching signal SW1 from a disabling state to an enabling state to turn on the first switch 130. Moreover, the logic unit 160 changes the second switching signal SW2 from the enabling state to the disabling state to turn off the second switch 140. After 10 ms, the output voltage OUT is equal to the reference voltage REF, so that the comparator 210 outputs logic 0, and the power on reset signal POR also has a low potential, the two input terminals of the first OR gate 220 are logic 0, and the output thereof is also logic 0, after passing through the first inverter 230, the logic 0 is changed to logic 1, the two input terminals of the AND gate 250 are all logic 1, so that the output of the AND gate 250 is also logic 1, and the first switch 130 implemented by the NMOSFET is turned on; while the two input terminals of the second OR gate 260 are respectively logic 1 and logic 0, so that the output thereof is logic 1, and the second switch 140 implemented by the PMOSFET is turned off Now, since the second switch 140 is turned off, the charge supplying source 120 is unnecessary to continually provide charges to the charge storage unit 150, and since the first switch 130 is turned on, the reference voltage source 110 can quickly maintain the output signal OUT to the reference voltage REF.

According to another aspect, since the large current supplied by the charge supplying source 120 can quickly increase the output signal OUT maintained by the charge storage unit 150 to the potential of the reference voltage REF without using a smaller current of the reference voltage source 110 to drive the charge storage unit 150, the output signal OUT can be quickly increased. When the potential of the output signal OUT is similar to the potential of the reference voltage REF, by switching the first and the second switches 130 and 140, the reference voltage source 110 maintains the output signal OUT, so that under a premise that the adjustment function of the reference voltage generating device is not changed, the stabilization time of the reference voltage can be quickly shortened.

It should be noticed that the comparator in the logic unit 160 only functions after receiving the power reset pulse PRP of the power on reset signal POR, and is unnecessary to continually compare the voltages after the output signal OUT is stabilized. Therefore, the comparator of the logic unit 160 of the present embodiment further includes a power control terminal to produce a feedback power control signal according to the output of the comparator. In this way, after the comparator determines that the output signal OUT is greater than or equal to the reference voltage REF, the comparator is turned off by itself to save power.

Particularly, the comparator 210 additionally has a power control terminal PWR, and when the power control terminal PWR receives the power control signal of logic 0, the comparator 210 is turned off by itself to save power. In the reference voltage generating device 100 of the present embodiment, the signal output through the output terminal of the first OR gate 220 is connected to the power control terminal PWR of the comparator 210, in this way, the feedback power control signal is generated according to the output of the comparator, so as to decrease the power consumption of the reference voltage generating device 100. In FIG. 3, a timing diagram of the feedback power control signal is illustrated.

Figure 4:
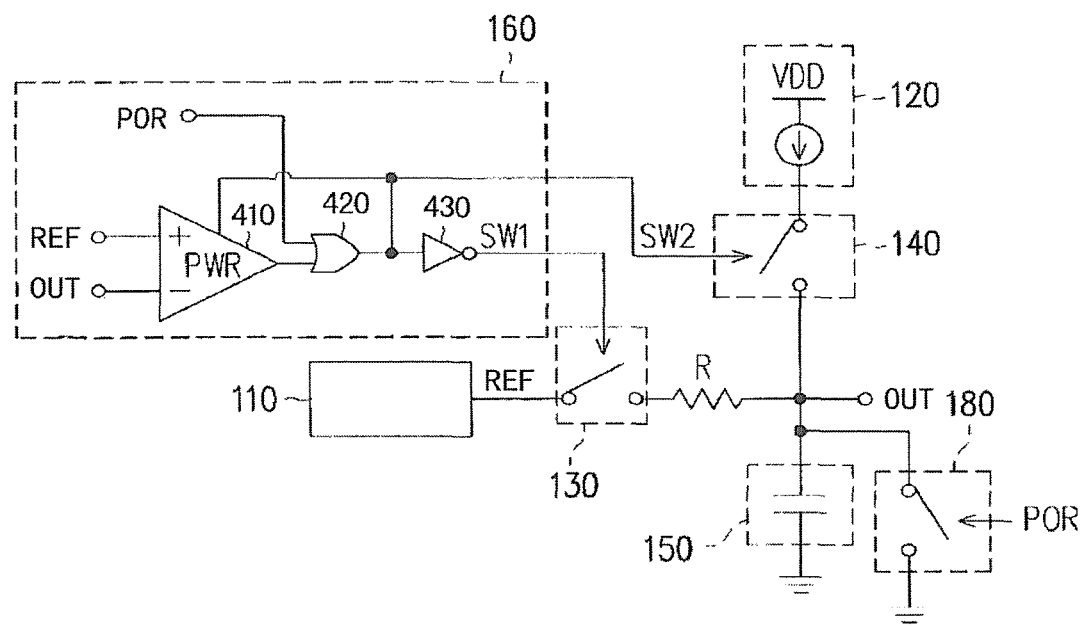
FIG. 4 is a second circuit diagram of a reference voltage generating device according to an embodiment of the invention.

Another circuit implementation complying with the spirits of the embodiment of the invention is provided below. Referring to FIG. 4, FIG. 4 is a second circuit diagram of the reference voltage generating device 100 according to an embodiment of the invention. A difference between FIG. 2 and FIG. 4 is that a circuit layout of various components in each of the logic units 160 is slightly different. Besides a comparator 410, the logic unit 160 further includes a first OR gate 420 and a first inverter 430. A first input terminal of the first OR gate 420 is coupled to an output terminal of the comparator 410. A second input terminal of the first OR gate 420 receives the power on reset signal POR. An input terminal of the first inverter 430 is coupled to an output terminal of the first OR gate 420 to generate the first switching signal SW1. The output terminal of the first OR gate 420 is coupled to the control terminal of the second switch 140 to generate the second switching signal SW2. In this way, the first switch 130 and the second switch 140 can all be implemented by the NMOSFET, or implemented by the PMOSFET, or implemented by other transmission gates. The output terminal of the first OR gate 420 can be coupled to the power control terminal PWR of the comparator 410. Applications and effects of other components can be deuced by referring the descriptions of the aforementioned embodiment.

Figure 5:
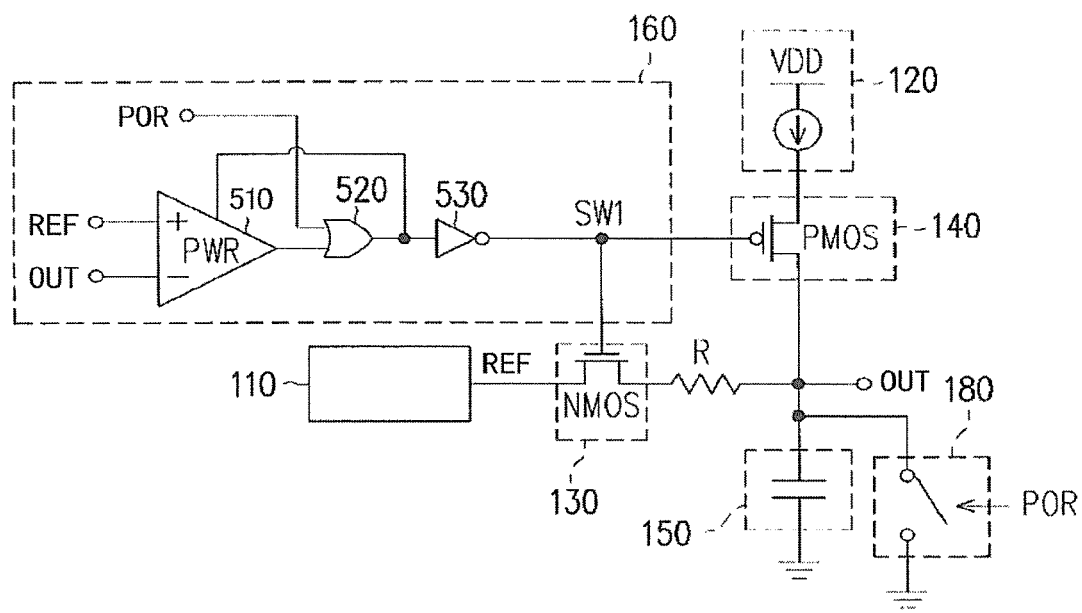
FIG. 5 is a third circuit diagram of a reference voltage generating device according to an embodiment of the invention.

Another circuit implementation complying with the spirits of the embodiment of the invention is provided below. Referring to FIG. 5, FIG. 5 is a third circuit diagram of the reference voltage generating device 100 according to an embodiment of the invention. A difference between FIG. 2 and FIG. 5 is that a circuit layout of various components in each of the logic units 160 is slightly different. Besides a comparator 510, the logic unit 160 further includes a first OR gate 520 and a first inverter 530. A first input terminal of the first OR gate 520 is coupled to an output terminal of the comparator 510. A second input terminal of the first OR gate 520 receives the power on reset signal POR. An input terminal of the first inverter 530 is coupled to an output terminal of the first OR gate 520 to generate the first switching signal SW1. In the present embodiment, the first switch 130 and the second switch 140 are respectively implemented by the NMOSFET and the PMOSFET. In this way, the control terminals of the first switch 130 and the second switch 140 are all coupled to the output terminal of the first OR gate 520 to receive the first switching signal SW1, so as to achieve the effects complied with the spirit of the invention.

In summary, in the reference voltage generating device of the invention, after the power on reset signal sends a power reset pulse, the charge supplying source connected to the power voltage is used to quickly charge the output voltage stored in the charge storage unit to a potential the same or similar with that of the reference voltage, and the reference voltage source is used to maintain the potential of the reference voltage. In this way, the reference voltage generating device can effectively shorten the stabilization time of the reference voltage, so as to avoid prolonging the unstable state of the reference voltage due to selection of a capacitance value, the low-pass filter, etc.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A reference voltage generating device, configured to receive a power voltage, the reference voltage generating device comprising:
a reference voltage source configured to generate a reference voltage at an output terminal thereof;
a charge supplying source configured to be connected to the power voltage;
a first switch, having a first terminal coupled to the output terminal of the reference voltage source;
a second switch, having a first terminal coupled to the charge supplying source;
a charge storage unit, coupled to a second terminal of the first switch and a second terminal of the second switch at a node that forms an output node of the reference voltage generating device, the charge storage unit configured to store charges and generate an output voltage at the output node of the reference voltage generating device; and
a logic unit, receiving the reference voltage, the output voltage and a power on reset signal to control the first switch and the second switch,
wherein when the power on reset signal is at a first predetermined state, the first switch is turned off and the second switch is turned on based on one or more control signals from the logic unit, such that the charge supplying source charges the charge storage unit, and when the output voltage is greater than or equal to the reference voltage, the first switch is turned on and the second switch is turned off based on the one or more control signals from the logic unit, such that the reference voltage source maintains the output voltage at or near a level of the reference voltage.

2. The reference voltage generating device as claimed in claim 1, wherein the logic unit comprises:
a comparator, having a non-inverted input terminal receiving the reference voltage, an inverted input terminal receiving the output voltage, and configured to determine whether the output voltage is greater than or equal to the reference voltage.

3. The reference voltage generating device as claimed in claim 2, wherein the comparator further comprises a power control terminal for receiving a power control signal to determine whether to turn off a power of the comparator.

4. The reference voltage generating device as claimed in claim 2, wherein the logic unit further comprises:
a first OR gate, having a first input terminal coupled to an output terminal of the comparator, and a second input terminal receiving the power on reset signal, wherein a power control terminal of the comparator is coupled to an output terminal of the first OR gate; and
a first inverter, having an input terminal coupled to the output terminal of the first OR gate,
wherein a control terminal of the first switch is coupled to an output terminal of the first inverter, a control terminal of the second switch is coupled to the output terminal of the first OR gate, and the first switch and the second switch are implemented by an N-type metal oxide semiconductor field effect transistor (MOSFET) or a P-type MOSFET.

5. The reference voltage generating device as claimed in claim 2, wherein the logic unit further comprises:
a first OR gate, having a first input terminal coupled to an output terminal of the comparator, and a second input terminal receiving the power on reset signal;
a first inverter, having an input terminal coupled to an output terminal of the first OR gate;
a second inverter, having an input terminal receiving the power on reset signal;

second OR gate, having a first input terminal coupled to an output terminal of the of the first inverter, a second input terminal configured to receive the power on reset signal; and an AND gate, having a first input terminal coupled to the output terminal of the first inverter, and a second input terminal coupled to an output terminal of the second inverter, wherein a control terminal of the first switch is coupled to an output terminal of the AND gate, a control terminal of the second switch is coupled to an output terminal of the second OR gate, the first switch is implemented by an N-type MOSFET, and the second switch is implemented by a P-type MOSFET.

6. The reference voltage generating device as claimed in claim 2, wherein the logic unit further comprises:

a first OR gate, having a first input terminal coupled to an output terminal of the comparator, and a second input terminal configured to receive the power on reset signal; and a first inverter, having an input terminal coupled to an output terminal of the first OR gate, wherein control terminals of the first switch and the second switch are coupled to an output terminal of the first inverter, the first switch is implemented by an N-type MOSFET, and the second switch is implemented by a P-type MOSFET.

7. The reference voltage generating device as claimed in claim 1, wherein the logic unit further comprises:

a third switch, having a first terminal coupled to the charge storage unit, a second terminal coupled to a ground, and a control terminal configured to receive the power on reset signal, wherein when the power on reset signal is received at the first predetermined state, the third switch is turned on based on control one or more control signals from the logic unit to clear the charges in the charge storage unit.

8. The reference voltage generating device as claimed in claim 1, further comprising:

a resistor, coupled between the second terminal of the first switch and the charge storage unit.

9. A method comprising:

charging a charge storage unit by using a charge supplying source, wherein the charge storage unit provides an output voltage;

stopping charging the charge storage unit by the charge supplying source when the output voltage provided by the charge storage unit is greater than or equal to the reference voltage of a reference voltage source; and maintaining the output voltage by using a reference voltage source after the charging of the charge storage unit has been stopped.

10. The method for generating the reference voltage as claimed in claim 9, wherein whether the output voltage is greater than or equal to the reference voltage is determined by a comparator, and the comparator having a non-inverted input terminal receiving the reference voltage and an inverted input terminal receiving the output voltage.

11. The method for generating the reference voltage as claimed in claim 10, wherein the comparator further comprises a power control terminal for receiving a power control signal to determine whether to turn off a power of the comparator.

12. The method for generating the reference voltage as claimed in claim 9, wherein:

the reference voltage source is controlled by a first switch, and a first terminal of the first switch is coupled to an output terminal of the reference voltage source;

the charge storage unit is controlled by a second switch, and a first terminal of the second switch is coupled to the charge supplying source; and the voltage of the reference voltage source is received by a logic unit, and the output voltage and a power on reset signal is used for controlling the first switch and the second switch.

13. The method for generating the reference voltage as claimed in claim 12, wherein when the power on reset signal is received, the first switch is turned off and the second switch is turned on, such that the charge supplying source charges the charge storage unit.

14. The method for generating the reference voltage as claimed in claim 12, wherein when the output voltage is greater than or equal to the reference voltage, the first switch is turned on and the second switch is turned off, such that the reference voltage source maintains the output voltage to the reference voltage.

15. The method for generating the reference voltage as claimed in claim 12, wherein the first switch is implemented by an N-type MOSFET, and the second switch is implemented by a P-type MOSFET.

16. A circuit for generating a stable output voltage, comprising:

a charge storage circuit configured to charge an output node of the circuit from a first level to a second level based on a charge supply from a charge supply source circuit;

a reference voltage circuit configured to generate a reference voltage;

a first switch coupled between the reference voltage circuit and the output node;

a second switch coupled between the charge supply source circuit and the output node; and a logic circuit configured to activate the second switch in a first phase to effectuate a charging of the output node from the first level to the second level, and configured to activate the first switch in a second phase when the second level is equal to the reference voltage or achieves a predetermined relationship with respect to the reference voltage.

17. The circuit of claim 16, wherein the logic circuit is configured to deactivate the first switch in the first phase, and deactivate the second switch in the second phase.

18. The circuit of claim 16, wherein the logic circuit is configured to compare a voltage at the output node with the reference voltage and continue the activation of the second switch during the first phase until the output node voltage and the reference voltage are equal or have the predetermined relationship with one another.

19. The circuit of claim 16, further comprising a third switch coupled between the output node and a predetermined potential, wherein upon a reset signal reaching a predetermined state, the logic circuit is configured to activate the third switch and discharge charge in the charge storage circuit to the predetermined potential and initiate the first phase after the charge storage circuit is discharged to the first level.

* * * * *